(12) United States Patent
Lebouitz et al.

(10) Patent No.: US 8,703,003 B2
(45) Date of Patent: Apr. 22, 2014

(54) SELECTIVE ETCHING OF SEMICONDUCTOR SUBSTRATE(S) THAT PRESERVES UNDERLYING DIELECTRIC LAYERS

(75) Inventors: Kyle S. Lebouitz, Pittsburgh, PA (US);
David L. Springer, Pittsburgh, PA (US);
John J. Neumann, Jr., Pittsburgh, PA (US)

(73) Assignee: SPTS Technologies Limited, Newport (GB)

( * ) Notice: Subject to any disclaimer, the term of this patent is extended or adjusted under 35 U.S.C. 154(b) by 530 days.

(21) Appl. No.: 12/763,635

(22) Filed: Apr. 20, 2010

(65) Prior Publication Data

US 2010/0267242 A1  Oct. 21, 2010

Related U.S. Application Data

(60) Provisional application No. 61/170,759, filed on Apr. 20, 2009, provisional application No. 61/171,909, filed on Apr. 23, 2009.

(51) Int. Cl.
*B44C 1/22*    (2006.01)
*C03C 15/00*   (2006.01)
*C03C 25/68*   (2006.01)
*C23F 1/00*    (2006.01)

(52) U.S. Cl.
USPC ............................................. 216/72; 438/714

(58) Field of Classification Search
USPC ............................................. 216/72; 438/714
See application file for complete search history.

(56) References Cited

U.S. PATENT DOCUMENTS

| | | | |
|---|---|---|---|
| 6,887,337 B2 | 5/2005 | Lebouitz et al. | |
| 6,942,811 B2* | 9/2005 | Patel et al. | 216/2 |
| 7,638,435 B2 | 12/2009 | Lebouitz et al. | |
| 2002/0008083 A1* | 1/2002 | Matsutani | 216/72 |
| 2006/0189134 A1 | 8/2006 | Cotte et al. | |
| 2007/0117396 A1 | 5/2007 | Wu et al. | |
| 2007/0117397 A1 | 5/2007 | Fu et al. | |
| 2008/0207001 A1* | 8/2008 | Lebouitz et al. | 438/706 |

* cited by examiner

*Primary Examiner* — Roberts Culbert
(74) *Attorney, Agent, or Firm* — McNees Wallace & Nurick LLC

(57) ABSTRACT

In a method of vapor etching, a sample that includes a first layer atop of and in contact with a second layer which is atop of and in contact with a third layer, wherein at least the first and second layers are comprised of different materials. The sample is etched by a vapor etchant under first process conditions that cause at least a part of the first layer to be fully removed while leaving the third layer and the second layer underlying the removed part of the first layer substantially unetched. The sample is then etched by the same or a different vapor etchant under second process conditions that cause at least the part of the second layer exposed by the removal of the at least part of the first layer to be fully removed while leaving the third layer underlying the removed part of the second layer substantially unetched.

20 Claims, 2 Drawing Sheets

SELECTIVE ETCHING OF SEMICONDUCTOR SUBSTRATE(S) THAT PRESERVES UNDERLYING DIELECTRIC LAYERS

CROSS REFERENCE TO RELATED APPLICATIONS

This application claims the benefit of U.S. provisional patent application Nos. 61/170,759 and 61/171,909, filed Apr. 20, 2009 and Apr. 23, 2009, respectively, both of which are incorporated herein by reference.

BACKGROUND OF THE INVENTION

1. Field of the Invention

The present invention relates to the manufacture of semiconductor devices and, more particularly, to the selective removal of layers for integrated device manufacture and the manufacture of MEMS using an etching gas while preserving one or more underlying dielectric layers.

2. Description of Related Art

Vapor etching of semiconductor materials and/or substrates can be accomplished using gases such as $XeF_2$, $KrF_2$, or $BrF_3$. In $XeF_2$ etching, $XeF_2$ gas reacts with one or more solid materials, such as silicon and molybdenum, such that the material(s) is/are converted to a gas phase. This removal of material by such etching is disclosed in, among other places, U.S. Pat. No. 7,638,435, which is incorporated herein by reference.

The selective removal of Si, SiGe, Ge, or transitional metals such as Ta, Ti and W, while preserving an underlying dielectric layer, such as silicon dioxide, silicon nitride or silicon carbide, is important in the manufacture of semiconductor devices and MEMS devices. This is also true for the removal of nitrides and alloys of transitional metals.

$XeF_2$ gas is often used for such removal since it etches many of the foregoing materials and the rate at which the etched material(s) is/are removed is much higher than the rate for one or more underlying dielectric materials. However with certain pairs of materials—for example silicon as the etched material and silicon nitride or silicon carbide as the dielectric—the chemical reaction between the $XeF_2$ and the etched material undesirably increases the etching of the dielectric material thereby reducing or eliminating the advantages of selective etching What is, therefore, needed is a method for vapor etching semiconductor or MEMS devices/substrates that enables the effective removal of one or more top layers of materials while substantially preserving (i.e., not removing too much of) one or more underlying dielectric material(s).

SUMMARY OF THE INVENTION

The invention is a method of vapor etching a sample comprised of a first layer atop of and in contact with a second layer which is atop of and in contact with a third layer, wherein at least the first and second layers are comprised of different materials. The method includes: (a) causing the sample to be etched under first process conditions by a first vapor etchant that causes at least a part of the first layer to be fully removed while leaving the third layer and the second layer underlying the removed part of the first layer substantially unetched; and (b) causing the sample to be etched under second process conditions by a second vapor etchant that causes at least the part of the second layer exposed by the removal of the at least part of the first layer in step (a) to be fully removed while leaving the third layer underlying the removed part of the second layer substantially unetched.

At least one of the following conditions can differ between the second process conditions and the first process conditions: a temperature of the sample during etching; a pressure of the vapor etchant during etching; a change of composition of the vapor etchant; an electric field applied to the sample during etching; or a UV light applied to the sample during etching.

The first layer can comprise a material that is readily etched by $XeF_2$, $KrF_2$, or $BrF_3$. The second layer can comprise a transitional metal, a nitride of a transitional metal, or an alloy of a transitional metal. The third layer can comprise a dielectric. In one non-limiting embodiment, the first layer can comprise Si, SiGe, Ge, or Mo; the second layer transitional metal can comprise Ta, TaN, Ti, TiN, TiW, or W; and the third layer dielectric can comprise SiC, $SiO_2$, or $Si_xN_y$, where the values of x and y can vary within ranges know in the art. One non-limiting example of $Si_xN_y$ is $Si_3N_4$.

The first process conditions can include at least one of the following: the sample at a temperature less than 100° C.; the sample at a temperature less than 10° C.; the pressure of the vapor etchant less than 5 torr; or the pressure of the vapor etchant less than 0.5 torr. The second process conditions can include at least one of the following: the sample at a temperature greater than 0° C.; the sample at a temperature greater than 90° C.; or the pressure of the vapor etchant between 0.2 torr and 100 torr.

The method can further include placing or forming a patterned mask atop of the first layer to define the part of the first layer to be fully removed.

The first vapor etchant can include at least one of the following: $XeF_2$, $KrF_2$, or $BrF_3$. The second vapor etchant can include at least one of the following: $XeF_2$, $KrF_2$, or $BrF_3$. The first and second vapor etchants can be the same or different.

The first vapor etchant, the second vapor etchant, or both can be mixed with mixing gas, such as, but not limited to, nitrogen or helium, or combinations of mixing gasses.

The invention is also a vapor etching method that includes (a) installing in a vapor etching chamber a sample comprised of a first layer atop of and in contact with a second layer which is atop of and in contact with a third layer, wherein the first and second layers are made from different materials that etch at different rates in response to different process conditions; (b) causing at least part of the first layer to be etched under first process conditions that cause the at least part of the first layer to be fully removed while not fully removing the third layer and the second layer underlying the removed part of the first layer; and (c) causing at least the part of the second layer exposed by the removal of the at least part of the first layer in step (b) to be etched under second process conditions that cause the at least part of the second layer underlying the removed part of the first layer to be fully removed while not fully removing the third layer underlying the removed part of the second layer.

The first and second process conditions can include a difference in at least one of the following: a temperature of the sample during etching; a pressure of the vapor etchant during etching; a change of composition of the vapor etchant; an electric field applied to the sample during etching; or a UV light applied to the sample during etching.

The first layer can comprise a material that is readily etched by $XeF_2$, $KrF_2$, or $BrF_3$. The second layer can comprise a transitional metal, a nitride of a transitional metal, or an alloy of a transitional metal. The third layer can comprise a dielectric. In one non-limiting embodiment, the first layer can comprise Si, SiGe, Ge, or Mo; the transitional metal can comprise Ta, TaN, Ti, TiN, TiW, or W; and the dielectric can comprise SiC, $SiO_2$, or $Si_xN_y$, where the values of x and y can vary within ranges known in the art. One non-limiting example of $Si_xN_y$ is $Si_3N_4$.

The first process conditions can include at least one of the following: the sample at a temperature less than 100° C.; the sample at a temperature less than 10° C.; the pressure of the vapor etchant less than 5 torr; or the pressure of the vapor etchant less than 0.5 torr. The second process conditions can include at least one of the following: the sample at a temperature greater than 0° C.; the sample at a temperature greater than 90° C.; or the pressure of the vapor etchant between 0.2 torr and 100 torr.

The first process conditions can include exposing the sample to at least one of the following vapor etchants: $XeF_2$, $KrF_2$, or $BrF_3$. The second process conditions can include exposing the sample to at least one of the following vapor etchants: $XeF_2$, $KrF_2$, or Br. The first and second etchants can be the same etchant or different etchants.

At least one of the process conditions can include mixing the vapor etchant with a mixing gas that reduces the rate of etching of the sample by the vapor etchant.

Lastly the invention is a vapor etching method that comprises: (a) installing in a vapor etching chamber a sample comprised of a first layer atop of and in contact with a second layer which is atop of and in contact with a third layer, wherein the first and second layers are made from different materials that etch at different rates in response to exposure to one or more vapor etchants under different process conditions; (b) causing at least part of the first layer to be etched by a first vapor etchant under first process conditions that cause the at least part of the first layer to be fully removed while substantially retaining the third layer and the second layer underlying the removed part of the first layer; and (c) causing at least the part of the second layer exposed by the removal of the at least part of the first layer in step (b) to be etched by a second vapor etchant under second process conditions that cause the at least part of the second layer underlying the removed part of the first layer to be fully removed while substantially retaining the third layer underlying the removed part of the second layer.

The first and second process conditions can include a difference in at least one of the following conditions: a temperature of the sample during etching; a pressure of the vapor etchant during etching; a change of composition of the vapor etchant; an electric field applied to the sample during etching; or a UV light applied to the sample during etching.

The first layer can comprise a material that is readily etched by $XeF_2$, $KrF_2$, or $BrF_3$. The second layer can comprise a transitional metal, a nitride of a transitional metal, or an alloy of a transitional metal. The third layer can comprise a dielectric. In one non-limiting embodiment, the first layer can comprise Si, SiGe, Ge, or Mo; the second layer can comprise Ta, TaN, Ti, TiN, TiW, or W; and the third layer can comprise SiC, $SiO_2$, or $Si_xN_y$, where the values of x and y for the latter can vary within ranges know in the art. One non-limiting example of $Si_xN_y$ is $Si_3N_4$. Each vapor etchant can comprise at least one of the following: $XeF_2$, $KrF_2$, or $BrF_3$. The first and second vapor etchants can be the same or different.

The first process conditions can include at least one of the following: the sample at a temperature less than 100° C.; or the pressure of the vapor etchant less than 5 torr. The second process conditions can include at least one of the following: the sample at a temperature greater than 90° C.; or the pressure of the vapor etchant between 0.2 torr and 100 torr.

A patterned mask can be placed atop of the first layer to define the part of the first layer to be fully removed.

The first vapor etchant, the second vapor etchant, or both can be mixed with a mixing gas such as, but not limited to, nitrogen or helium, or combinations of mixing gasses.

DETAILED DESCRIPTION OF THE INVENTION

Figure 1:
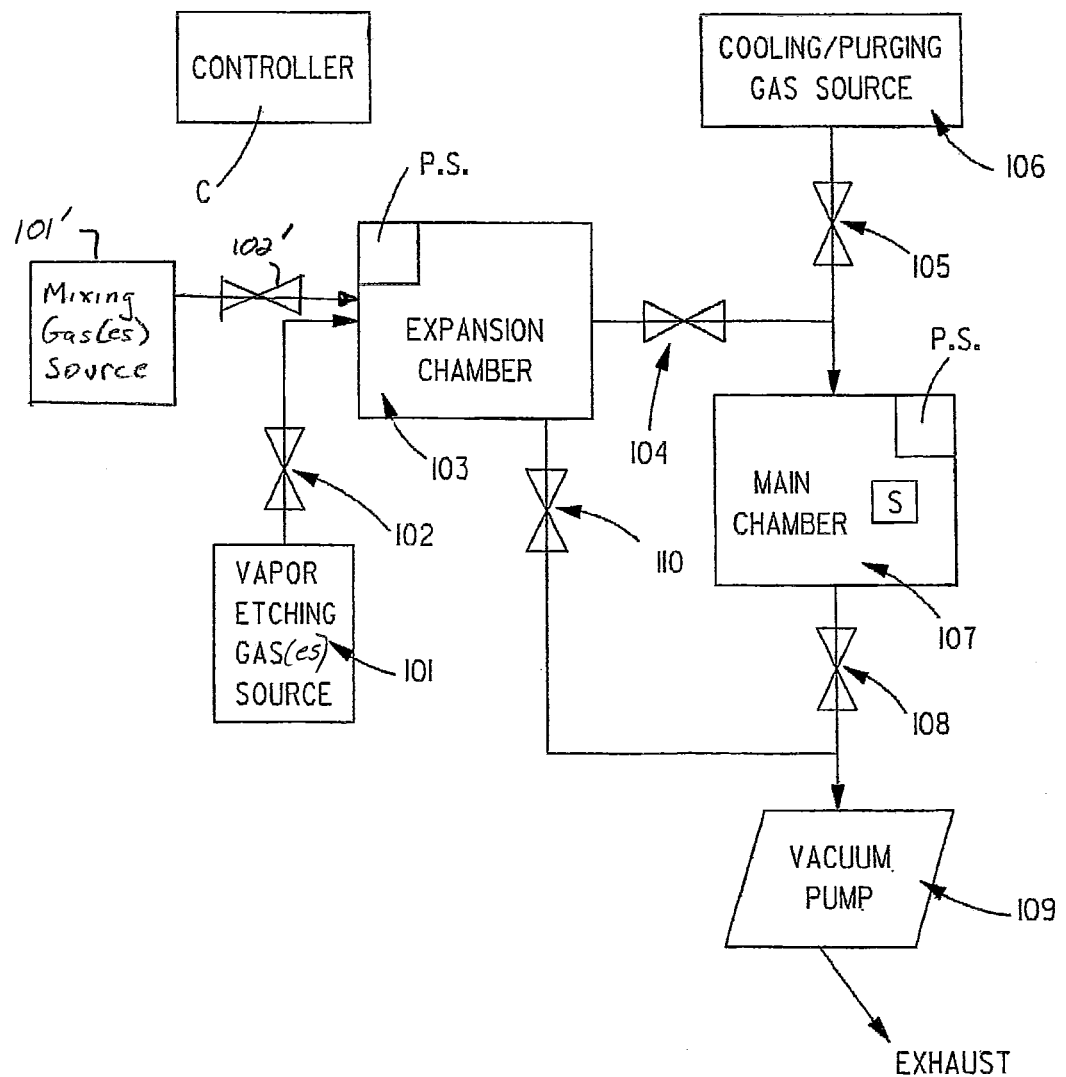
FIG. 1 is a schematic view of an exemplary vapor etching system that can be used for etching a semiconductor or MEMS sample in accordance with the present invention.

With reference to FIG. 1, a vapor etching gas(es) source 101, e.g., one or more cylinders of the same or different etching gas(es), such as, without limitation, $XeF_2$, $KrF_2$, and/or $BrF_3$ is/are connected to an expansion chamber 103 by one or more valves 102, desirably pneumatically operated valves. Expansion chamber 103 acts as an intermediate chamber for regulating the quantity of etching gas(es) in each pulse or cycle. In one exemplary embodiment, expansion chamber 103 has a volume of 0.6 liters. However, this is not to be construed as limiting the invention since the volume of expansion chamber 103 can be any suitable and/or desirable volume, e.g., between 0.1 liters and 20 liters or greater.

Expansion chamber 103 can be optionally independently evacuated by a vacuum pump 109 via a valve 110, desirably a pneumatically operated valve. Desirably, a pressure sensor (P.S.), e.g., without limitation, a capacitance diaphragm gauge, is included in fluid communication with expansion chamber 103. In addition, expansion chamber 103 may have an additional connection and valve 102' along with, typically, a needle valve (not shown) to allow for the introduction of other gases, such as one or more inert mixing gases, e.g., nitrogen and/or helium, from a mixing gas(es) source 101' into expansion chamber 103. While the system in FIG. 1, may include more that one valve 102, each connected to a different cylinder of the same or a different etching gas, and/or more than one valve 102', each connected to a different cylinder of the same or a different mixing gas, only one value 102 and one valve 102' are shown in FIG. 1 and described herein for the purpose of simplicity.

Expansion chamber 103 is connected to a main vacuum chamber 107 via a valve 104, desirably a pneumatically operated valve. Main chamber 107 may also have a pressure sensor (P.S.), e.g., without limitation, a capacitance diaphragm gauge, in fluid communication therewith.

An optional cooling/purging gas source 106, e.g., one or more cylinders of the same or different cooling/purging gas (es), can also be connected to main chamber 107 via one or more valves 105, desirably a pneumatically operated valves. While the system in FIG. 1, may include more that one valve 105, each connected to a different cylinder of the same or a different cooling/purging gas, only one value 105 is shown in FIG. 1 and described herein for the purpose of simplicity.

Main chamber 107 is where the sample(s) S to be etched is/are located. Chamber 107 is evacuated via vacuum pump 109, desirably a dry pump, via valve 108, desirably a pneumatically operated valve. In one exemplary embodiment, main chamber 107 has a volume of 0.6 liters. However, this is not to be construed as limiting the invention since the volume of main chamber 107 can be any suitable or desirable volume, e.g., between 0.1 liter and 20 liters or greater, deemed desirable and/or necessary by one skilled in the art to accommodate the size of the sample(s) S to be etched therein.

Other modifications to the aforementioned system are anticipated such as those described in U.S. Pat. No. 6,887,337 which is incorporated herein by reference. These modifications include, but are not limited to, a variable volume expansion chamber, multiple expansion chambers, and multiple gas sources. Also, in some circumstances, such as the use of hazardous gases for cooling, it may be desirable to add a dedicated chamber venting connection rather than solely using valve 105 and cooling/purging gas source 106 for purging and venting main chamber 107.

In addition, other noble gas fluorides, such as krypton difluoride ($KrF_2$), or halogen fluorides, such as bromine trifluoride ($BrF_3$), may also or alternatively be considered for etching.

In addition, the use of any combination or sequence of the etching gases and/or mixing gases described herein is also envisioned.

A typical etching sequence is to load sample(s) S into main chamber 107. Main chamber 107 is then evacuated by opening valve 108 which connects vacuum pump 109 to main chamber 107. Desirably, main chamber 107 is pumped down or evacuated, for example, to less than 1 torr, e.g., to approximately 0.3 torr, whereupon valve 108 is closed. Main chamber 107 may be further purged of atmosphere by opening valve 105, thereby allowing cooling/purging gas from cooling/purging gas source 106 to flow into main chamber 107 to approximately 400 torr (anywhere from 1 torr to 600 torr would be useful, though) at which point valve 105 is closed and valve 108 is opened whereupon main chamber 107 is pumped down or evacuated again. These purges and pumps can be repeated any number of times to prepare main chamber 107 for etching sample(s) S by minimizing moisture and undesired atmospheric gases in main chamber 107 which can react with one or more etching gases, e.g., $XeF_2$, to form hydrofluoric acid which can attack non-silicon materials.

At a suitable time, expansion chamber 103 is evacuated by opening valve 110 which connects vacuum pump 109 to expansion chamber 103. Desirably, expansion chamber 103 is pumped down to, for example, less than 1 torr, e.g., to approximately 0.3 torr or below, whereupon valve 110 is closed. Desirably, the evacuation of expansion chamber 103 by vacuum pump 109 occurs independent of the evacuation of main chamber 107 by vacuum pump 109. However, this is not to be construed as limiting the invention as it is envisioned that the evacuation of expansion chamber 103 and main chamber 107 can occur simultaneously if desired.

Once expansion chamber 103 has been purged of atmosphere to a sufficient extent, vapor etching gas(es) source 101 is connected to the expansion chamber 103 by opening valve 102. Since expansion chamber 103 has been purged of atmosphere, e.g., to approximately 0.3 torr or below, etching gas(es) will flow from vapor etching gas source 101 into expansion chamber 103. Optionally, one or more mixing gases can also be introduced into expansion chamber 103 from mixing gas(es) source 101' for diluting the etching gas in expansion chamber 103 by opening valve 102'. Regardless if only etching gas(es) is/are introduced into expansion chamber 103 or the combination of etching gas(es) and one or more mixing gases are introduced into expansion chamber 103, the introduction of gas(es) into expansion chamber 103 is stopped by closing valve 102, and, as necessary, valve 102', when the pressure in expansion chamber 103 desirably reaches between 0.4 torr and 5 torr (anywhere between 0.2 torr to 600 torr would be useful, though).

Once valve 102, and, as necessary, valve 102', is/are closed, valve 104 is opened, thereby allowing etching gas(es) (and, if provided, mixing gas(es)) in expansion chamber 103 to flow into main chamber 107 which has been pumped by vacuum pump 109 via valve 108 to a pressure below that of expansion chamber 103, e.g., between 0.01 torr and 1 torr. In response to sample(s) S being exposed to etching gas received in main chamber 107 from expansion chamber 103, etching begins on sample(s) S.

Valve 108 is opened after a specified period for etching sample(s) S, which is typically 30 seconds or less. Since valves 104 and 108 are open and since valves 102, 105 and 110 are closed, the pressures in both main chamber 107 and expansion chamber 103 fall in response to the action of vacuum pump 109 acting on expansion chamber 103 and main chamber 107 via open valves 104 and 108. When the pressure in expansion chamber 103 falls to a set point between 0.01 torr and 5 torr, valves 104 and 108 are closed. Expansion chamber 103 may be further evacuated as needed via valve 110 until reaching approximately 0.3 torr, whereupon expansion chamber 103 is then refilled with gas(es) as described above in preparation for introduction of the next charge or pulse of etching gas(es) into main chamber 107. The above cycle of introducing charges or pulses of etching gas(es) (and, if provided, mixing gas(es)) into main chamber 107 can continue until sufficient etching of sample(s) S has been accomplished. Each charge or pulse of etching gas(es) can introduce the same or a different etching gas into main chamber 107 for etching different layers of sample (S) described hereinafter.

Where it is desired to optionally cool sample(s) S between the introduction of pulses of etching gas(es) (and, if provided, mixing gas(es)) into main chamber 107, valve 105 can be opened between the pulses of etching gas(es) (and, if provided, mixing gas(es)) into main chamber 107, thereby allowing cooling/purging gas(es), e.g., nitrogen, to flow from cooling/purging gas source 106 into main chamber 107 until the pressure therein reaches 30 torr (although any pressure from 5 torr to 500 torr would work) whereupon valve 105 is closed. After valve 105 is closed, the cooling/purging gas(es) is allowed to remain in main chamber 107 for a sufficient period of time, such as, without limitation, less than 20 seconds, e.g., approximately 15 seconds, to reduce the temperature of sample(s) S to a desired temperature, e.g., close to its original or starting temperature.

Once sufficient cooling time has passed for sample(s) S, main chamber 107 is evacuated by opening valve 108. The introduction of pulses of etching gas(es) (and, if provided, mixing gas(es)) and cooling gas(es) is then repeated until sufficient etching has been accomplished.

Regardless if sample(s) S is etched by pulses of etching gas(es) (and, if provided, mixing gas(es)) alone or by pulses of etching gas(es) (and, if provided, mixing gas(es)) and cooling gas(es), once etching is complete, sample(s) S can be removed by using the same sequence of pumps and purges that were used for the loading of sample(s) S followed by a venting step where valve 105 is opened until the main chamber pressure reaches atmospheric pressures.

A controller (C) can be provided for automatically controlling the operation of the system shown in FIG. 1. For example, controller C can be connected to each pressure sensor P.S. for detecting the pressure in the corresponding chamber 103 and/or 107 and to each of valves 102, 102', 104, 105, 108 and 110 for controlling the sequence and operation thereof in the manner described above. Controller C can be any suitable and desirable type.

The disclosure of nitrogen as the cooling/purging gas has been used for convenience. However, it is envisioned that other gases, either individually or in combination, may yield an improvement. For example, the use of helium may provide additional benefit because of its higher thermal conductivity than nitrogen. A higher thermal conductivity will mean that the cooling time required per cycle can be reduced.

Alternatively, expansion chamber 103 can be omitted and vapor etching gas(es) source 101 and, optionally, mixing gas(es) source 101' can be connected directly to main chamber 107 for supplying a pulsed or continuous flow of etching gas and, optionally, mixing gas(es) and/or, optionally, cooling/purging gas(es) to main chamber 107 for etching of sample(s) S. When expansion chamber 103 is not present, one or more suitable and/or desirable flow controllers, e.g., without limitation, a mass flow controller, either standing alone or under the control of controller C, can optionally be utilized for controlling the pulsed or continuous flow of at least one of the following into main chamber 107: etching gas(es); mixing gas(es); and/or cooling/purging gas(es).

In another alternative, expansion chamber 103 can remain in the path of a continuous flow of etching gas(es) and/or mixing gas(es) into main chamber 107, i.e., expansion chamber 103 is NOT utilized for buffering a charge or pulse of etching gas(es) and/or mixing gas(es) introduced into main chamber 107. In this alternative, expansion chamber 103 can include a pressure controller that enables the pressure of the etching gas(es) and/or mixing gas(es) supplied to main chamber 107 via expansion chamber 103 to be controlled.

The methods and apparatus described above for etching sample(s) S are exemplary only and are not to be construed as limiting in any manner to accomplish etching as described hereinafter.

It has been observed that the etch rates of Ta and TaN using $XeF_2$ gas can be controlled. More specifically, film samples of Ta and TaN deposited atop of silicon nitride (SiN) layers on $SiO_2$ wafers were etched in an enclosed process chamber, like main chamber 107, via pulses of $XeF_2$ gas. The pressure of the $XeF_2$ gas in the process chamber during each pulse was approximately 0.2 torr and each pulse of $XeF_2$ gas was approximately 30 seconds in duration. The etch rates for Ta film samples at 60° C. and 100° C. were observed to be 15 Å/min and 200 Å/min, respectively, while the etch rates for TaN at 60° C. and 100° C. were observed to be <50 Å/min and 190 Å/min, respectively. The etch rates of Ta and TaN continued to increase with temperatures up to 190° C. and it is expected that increased $XeF_2$ gas pressure would also increase the etch rates of Ta and TaN. Moreover, temperatures over 90° C. increase the etch rate of Ti while temperatures below 10° C. show no identifiable etching of Ti.

It is believed that exposing SiN and $SiO_2$ to UV light while in the presence of $XeF_2$ gas will accelerate their etch rates. Moreover, it is believed that the use of $XeF_2$ gas in the presence of an ion mill or a focused ion beam (FIB) may also be used to modify the etch rate of various materials.

Figure 2:
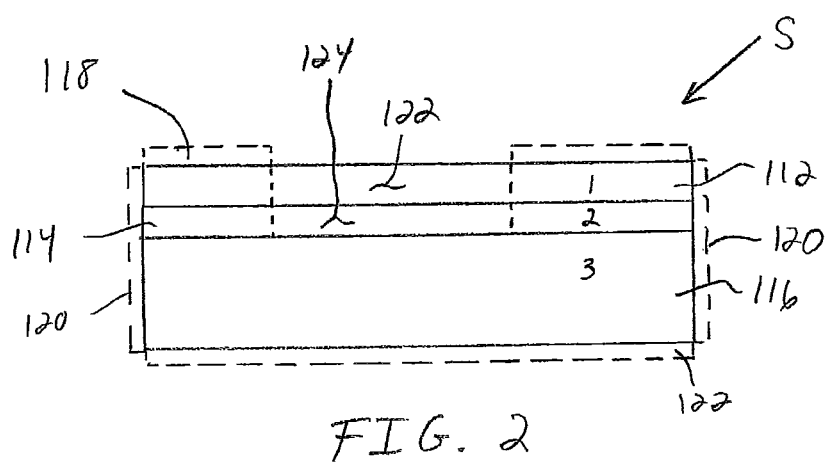
FIG. 2 is a schematic side view of a pre-etched semiconductor or MEMS sample constructed for etching in accordance with the present invention.

With reference to FIG. 2, to increase the etching selectivity between one or more materials to be etched 112 and a dielectric 116 of a semiconductor or MEMS sample(s) S when using $XeF_2$, $KrF_2$, or $BrF_3$ etching gas, a barrier material 114 is introduced between the one or more materials to be etched 112 and the dielectric 116. This barrier material 114 is comprised of a transitional metal or an alloy or compound comprised of a transitional metal whose etch rate can be varied by changing the etching process conditions, such as, without limitation, the temperature of the one or more materials being etched 112 or the pressure of the etching gas, but also other factors such as an applied electric field or UV light. The type of etching gas used can also be an etching process condition.

In FIG. 2, layer 1 (112) comprises a material which readily etches in one or a combination of $XeF_2$, $KrF_2$, or $BrF_3$ gas, layer 2 (114) comprises a transitional metal, a nitride of a transitional metal, or an alloy or compound including a transitional metal whose etch rate in the presence of the same etching gas(es) or a different etching gas(es) can be manipulated, and layer 3 (116) comprises a dielectric.

As can be seen, layer 2 (114) is in contact with both layer 1 (112) and layer 3 (116) and separates those layers from each other in the entire region in which layer 1 (112) is to be removed.

An exemplary, non-limiting, etching sequence using $XeF_2$ etching gas will now be described. However, the description of using $XeF_2$ etching gas is not to be construed as limiting the invention. After the introduction of the sample(s) S shown in FIG. 2 into an enclosed process chamber, like main chamber 107, a first etching step is performed on sample(s) S using gas under conditions which fully remove at least part 122 of layer 1 (112) but which does not fully remove layer 2 (114) underlying the removed part of layer 1 (112). When layer 2 (114) is a transitional metal, such as, without limitation, Ta, TaN, Ti, TiN, TiW, W, a nitride of a transitional metal or metals, or an alloy or compound comprised of a transitional metal or metals, the temperature of sample(s) S during etching is desirably below 100° C. and more desirably below 10° C., and the $XeF_2$ pressure is desirably below 5 torr and more desirably below 0.5 T.

Once the first etching step is complete, a second etching step is performed which fully removes at least the part 124 of layer 2 (114) underlying the removed part 122 of layer 1 (112) selectively to layer 3 (116) with little or no removal of the part of layer 3 (116) underlying the removed part of layer 2 (114). One or more processes for removing layer 2 (114) may be used. When layer 2 (114) is Ta, TaN, Ti, TiN, TiW, W, or a nitride or an alloy of a transitional metal or metals, and $XeF_2$ is used for etching layer 2 (114), the temperature of sample(s) S is desirably above 0° C. and more desirably above 90° C. and the $XeF_2$ pressure is desirably between 10 torr to 100 torr. If desired or required, a different etching gas may be used for removing layer 2 (114).

As can be seen, layer 1 (112) can be removed with little or no etching of layer 3 (116) effectively increasing the selectivity between layer 1 (112) and layer 3 (116).

Further reduction in the etch rate of layer 2 (114) relative to layer 1 (112) can be achieved by mixing $XeF_2$ gas with one or more mixing gas(es) 101', e.g., nitrogen and/or helium, in either a pulsed flow or a continuous flow of $XeF_2$ gas and mixing gas(es). In the case of pulsed flow, the partial pressure of $XeF_2$ gas is desirably between 0.2 torr and 100 torr and the partial pressure of the mixing gas(es), e.g., nitrogen, is between 1 torr and 300 torr. More desirably, the partial pressure of $XeF_2$ is between 0.2 T and 1 T and the partial pressure of the mixing gas(es), e.g., nitrogen, is between 10 torr and 30 torr.

A further reduction of the etch rate of layer 2 (114) relative to layer 1 (112) can be achieved by purging the process chamber between periods of etching using a cooling/purging gas, such as nitrogen or helium, at a gas pressure desirably between 5 torr and 300 torr, and more desirably between 10 torr and 30 torr.

Non-limiting examples of layer 3 (116) include SiC, $SiO_2$, or $Si_xN_y$, where the values of x and y can vary within ranges know in the art. One non-limiting example of $Si_xN_y$ is $Si_3N_4$. Non-limiting examples of layer 2 (114) include Ta, TaN, Ti, TiN, TiW, W, or a nitride or an alloy of a transitional metal or metals. Non-limiting examples of layer 1 (112) include silicon (Si), silicon germanium (SiGe), germanium (Ge), or molybdenum (Mo).

In addition, other layers may be present above and below the stack of layers 1, 2 and 3. For example, a patterned mask 118 (shown in phantom) that is either not etched by $XeF_2$ gas or is not etched by $XeF_2$ gas as quickly as layer 1 can be placed or formed atop layer 1 and/or one or more etch stops 120 (also shown in phantom) can be included on the sides of layers 1, 2 and/or 3 to selectively etch only desired regions of layers 1 and 2. Also or alternatively, layer 3 can be deposited atop a substrate 122 (shown in phantom), such as, without limitation, silicon or glass, or on top of one or more other layers which have been deposited atop substrate 122.

The invention has been described with reference to the preferred embodiments. Obvious modifications and alterations will occur to others upon reading and understanding the preceding detailed description. It is intended that the invention be construed as including all such modifications and alterations insofar as they come within the scope of the appended claims or the equivalents thereof.

The invention claimed is:

1. A method of vapor etching a sample comprised of a first layer atop of and in contact with a second layer which is atop of and in contact with a third layer, wherein at least the first and second layers are comprised of different materials, the method comprising:
   (a) causing the sample to be etched by a first vapor etchant in a main chamber under first process conditions that cause at least a part of the first layer to be fully removed while leaving the third layer and the second layer underlying the removed part of the first layer substantially unetched; and
   (b) causing the sample to be etched by a second vapor etchant in the main chamber under second process conditions that cause at least the part of the second layer exposed by the removal of the at least part of the first layer in step (a) to be fully removed while leaving the third layer underlying the removed part of the second layer substantially unetched;
   wherein the first layer comprises a material that is readily etched by $XeF_2$, $KrF_2$, or $BrF_3$, the second layer comprises a transitional metal, a nitride of a transitional metal, or an alloy of a transitional metal, and the third layer comprises a dielectric.

2. The method of claim 1, wherein at least one of the following conditions differ between the second process conditions and the first process conditions:
   a temperature of the sample during etching;
   a pressure of the vapor etchant during etching;
   a change of composition of the vapor etchant;
   an electric field applied to the sample during etching; or
   a UV light applied to the sample during etching.

3. The method of claim 1, wherein:
   the first layer comprises Si, SiGe, Ge, or Mo;
   the second layer transitional metal comprises Ta, TaN, Ti, TiN, TiW, or W; and
   the third layer dielectric comprises SiC, $SiO_2$, or $Si_xN_y$.

4. The method of claim 1, wherein:
   the first process conditions include at least one of the following:
      the sample at a temperature less than 100° C.;
      the sample at a temperature less than 10° C.;
      the pressure of the vapor etchant less than 5 torr; or
      the pressure of the vapor etchant less than 0.5 torr;
   and
   the second process conditions include at least one of the following:
      the sample at a temperature greater than 0° C.;
      the sample at a temperature greater than 90° C.; or
      the pressure of the vapor etchant between 0.2 torr and 100 torr.

5. The method of claim 1, further including placing or forming a patterned mask atop of the first layer to define the part of the first layer to be fully removed.

6. A method of vapor etching a sample comprised of a first layer atop of and in contact with a second layer which is atop of and in contact with a third layer, wherein at least the first and second layers are comprised of different materials, the method comprising:
   (a) causing the sample to be etched by a first vapor etchant in a main chamber under first process conditions that cause at least a part of the first layer to be fully removed while leaving the third layer and the second layer underlying the removed part of the first layer substantially unetched; and
   (b) causing the sample to be etched by a second vapor etchant in the main chamber under second process conditions that cause at least the part of the second layer exposed by the removal of the at least part of the first layer in step (a) to be fully removed while leaving the third layer underlying the removed part of the second layer substantially unetched;
   wherein the first vapor etchant includes at least one of the following: $XeF_2$, $KrF_2$, or $BrF_3$ and the second vapor etchant includes at least one of the following: $XeF_2$, $KrF_2$, or $BrF_3$.

7. The method of claim 6, wherein either the first vapor etchant, the second vapor etchant, or both is/are mixed with a mixing gas that alters the rate of etching of the sample by the vapor etchant(s).

8. A vapor etching method comprising:
   (a) installing in a vapor etching chamber a sample comprised of a first layer atop of and in contact with a second layer which is atop of and in contact with a third layer, wherein the first and second layers are made from different materials that etch at different rates in response to different process conditions;
   (b) causing at least part of the first layer to be etched in the vapor etching chamber under first process conditions that cause the at least part of the first layer to be fully removed while not fully removing the third layer and the second layer underlying the removed part of the first layer; and
   (c) causing at least the part of the second layer exposed by the removal of the at least part of the first layer in step (b) to be etched in the vapor etching chamber under second process conditions that cause the at least part of the second layer underlying the removed part of the first layer to be fully removed while not fully removing the third layer underlying the removed part of the second layer;
   wherein the first layer comprises a material that is readily etched by $XeF_2$, $KrF_2$, or $BrF_3$, the second layer comprises a transitional metal, a nitride of a transitional metal, or an alloy of a transitional metal, and the third layer comprises a dielectric.

9. The method of claim 8, wherein the first and second process conditions include a difference in at least one of the following:
   a temperature of the sample during etching;
   a pressure of the vapor etchant during etching;
   a change of composition of the vapor etchant;
   an electric field applied to the sample during etching; or
   a UV light applied to the sample during etching.

10. The method of claim 8, wherein:
   the first layer comprises Si, SiGe, Ge, or Mo;
   the transitional metal comprises Ta, TaN, Ti, TiN, TiW, or W; and the dielectric comprises SiC, SiO$_2$, or Si$_x$N$_y$.

11. The method of claim 8, wherein:
the first process conditions include at least one of the following:
the sample at a temperature less than 100° C.;
the sample at a temperature less than 10° C.;
the pressure of the vapor etchant less than 5 torr; or
the pressure of the vapor etchant less than 0.5 torr;
and
the second process conditions include at least one of the following:
the sample at a temperature greater than 0° C.;
the sample at a temperature greater than 90° C.; or
the pressure of the vapor etchant between 0.2 torr and 100 torr.

12. A vapor etching method comprising:
(a) installing in a vapor etching chamber a sample comprised of a first layer atop of and in contact with a second layer which is atop of and in contact with a third layer, wherein the first and second layers are made from different materials that etch at different rates in response to different process conditions;
(b) causing at least part of the first layer to be etched in the vapor etching chamber under first process conditions that cause the at least part of the first layer to be fully removed while not fully removing the third layer and the second layer underlying the removed part of the first layer; and
(c) causing at least the part of the second layer exposed by the removal of the at least part of the first layer in step (b) to be etched in the vapor etching chamber under second process conditions that cause the at least part of the second layer underlying the removed part of the first layer to be fully removed while not fully removing the third layer underlying the removed part of the second layer;
wherein the first process conditions include exposing the sample to at least one of the following vapor etchants: XeF$_2$, KrF$_2$, or BrF$_3$, and the second process conditions include exposing the sample to at least one of the following vapor etchants: XeF$_2$, KrF$_2$, or BrF$_3$.

13. The method of claim 12, wherein the first and second etchants are the same etchant.

14. The method of claim 12, wherein at least one of the process conditions includes mixing the vapor etchant with a mixing gas that alters the rate of etching of the sample by the vapor etchant.

15. A vapor etching method comprising:
(a) installing in a vapor etching chamber a sample comprised of a first layer atop of and in contact with a second layer which is atop of and in contact with a third layer, wherein the first and second layers are made from different materials that etch at different rates in response to exposure to one or more vapor etchants under different process conditions;
(b) causing at least part of the first layer to be etched in the vapor etching chamber by a first vapor etchant under first process conditions that cause the at least part of the first layer to be fully removed while substantially retaining the third layer and the second layer underlying the removed part of the first layer; and
(c) causing at least the part of the second layer exposed by the removal of the at least part of the first layer in step (b) to be etched in the vapor etching chamber by a second vapor etchant under second process conditions that cause the at least part of the second layer underlying the removed part of the first layer to be fully removed while substantially retaining the third layer underlying the removed part of the second layer;
wherein the first layer comprises a material that is readily etched by XeF$_2$, KrF$_2$, or BrF$_3$, the second layer comprises a transitional metal, a nitride of a transitional metal, or an alloy of a transitional metal, and the third layer comprises a dielectric.

16. The method of claim 15, wherein the first and second process conditions include a difference in at least one of the following conditions:
a temperature of the sample during etching;
a pressure of the vapor etchant during etching;
a change of composition of the vapor etchant;
an electric field applied to the sample during etching; or
a UV light applied to the sample during etching.

17. The method of claim 15, wherein:
the first layer comprises Si, SiGe, Ge, or Mo;
the second layer comprises Ta, TaN, Ti, TiN, TiW, or W;
the third layer comprises SiC, SiO$_2$, or Si$_x$N$_y$; and
each vapor etchant comprises at least one of the following: XeF$_2$, KrF$_2$, or BrF$_3$.

18. The method of claim 15, wherein:
the first process conditions include at least one of the following:
the sample at a temperature less than 100° C.; or the pressure of the vapor etchant less than 5 torr;
and the second process conditions include at least one of the following:
the sample at a temperature greater than 90° C.; or
the pressure of the vapor etchant between 0.2 torr and 100 torr.

19. The method of claim 15, further including placing or forming a patterned mask atop of the first layer to define the part of the first layer to be fully removed.

20. The method of claim 15, wherein the vapor etchant inside the chamber is mixed with at least one of the following mixing gases: nitrogen or helium.

* * * * *